United States Patent
Hu et al.

(10) Patent No.: US 11,467,905 B1
(45) Date of Patent: Oct. 11, 2022

(54) STRIPE MERGING METHOD AND SYSTEM BASED ON ERASURE CODES

(71) Applicant: HUAZHONG UNIVERSITY OF SCIENCE AND TECHNOLOGY, Hubei (CN)

(72) Inventors: Yuchong Hu, Hubei (CN); Qiaori Yao, Hubei (CN); Liangfeng Cheng, Hubei (CN); Yazhe Zhang, Hubei (CN); Dan Feng, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 17/477,476

(22) Filed: Sep. 16, 2021

(30) Foreign Application Priority Data

Jul. 8, 2021 (CN) .......................... 202110774701.0

(51) Int. Cl.
    *G06F 11/10*   (2006.01)
    *G06F 11/00*   (2006.01)
    *H03M 13/15*   (2006.01)
    *G06F 3/06*    (2006.01)

(52) U.S. Cl.
    CPC ........ *G06F 11/1076* (2013.01); *G06F 3/0619* (2013.01); *G06F 3/0644* (2013.01); *G06F 3/0647* (2013.01); *G06F 3/0652* (2013.01); *G06F 3/0673* (2013.01); *G06F 11/1004* (2013.01); *H03M 13/154* (2013.01)

(58) Field of Classification Search
CPC .. G06F 11/1076; G06F 3/0619; G06F 3/0644; G06F 3/0647; G06F 3/0652; G06F 3/0673; G06F 11/1004; H03M 13/154
See application file for complete search history.

(56) References Cited

U.S. PATENT DOCUMENTS

| | | | |
|---|---|---|---|
| 2008/0091916 A1* | 4/2008 | Hashemi | G06F 3/0644 711/209 |
| 2015/0149819 A1* | 5/2015 | Lee | G06F 11/1076 714/6.24 |
| 2016/0117133 A1* | 4/2016 | Blaum | G06F 3/0619 711/114 |
| 2019/0310915 A1* | 10/2019 | Camp | G06F 11/1096 |
| 2019/0310916 A1* | 10/2019 | Patel | G06F 3/0619 |
| 2022/0188044 A1* | 6/2022 | Won | G06F 3/0689 |

* cited by examiner

*Primary Examiner* — Justin R Knapp
(74) *Attorney, Agent, or Firm* — JCIP Global Inc.

(57) ABSTRACT

A stripe merging method and system based on erasure codes are provided. A StripeMerge-P algorithm is used first to determine alignment information of parity chunks of erasure code stripes based on a preprocessed hash table. Through a greedy strategy, erasure code stripe pairs to be merged are selected for merging. Through the hash table, location information of the parity chunks is directly looked up, so that no additional computing overhead is required, and the overhead of selecting and merging the erasure code stripe pairs is further reduced through the combination with the greedy strategy.

10 Claims, 3 Drawing Sheets

STRIPE MERGING METHOD AND SYSTEM BASED ON ERASURE CODES

CROSS-REFERENCE TO RELATED APPLICATION

This application claims the priority benefit of China application Ser. No. 202110774701.0, filed on Jul. 8, 2021. The entirety of the above-mentioned patent application is hereby incorporated by reference herein and made a part of this specification.

BACKGROUND

Technical Field

The disclosure belongs to the field of computer storage, and in particular, relates to a stripe merging method and system based on erasure codes.

Description of Related Art

Erasure codes are widely deployed in modern large-scale storage systems and are used to store data chunks and parity chunks to achieve high-efficient storage fault tolerance. Many types of erasure codes are available, and the Reed-Solonon codes are the most popular codes and have been widely used in industry. In practice, a large-scale storage system stores a plurality of stripes, which are independently coded and distributed on different sets of k+m nodes. Further, each block is usually configured with a large size, for example, 64 MiB or 256 MiB, so that the I/O overhead may be reduced in this way. Recently, the concept of wide stripes is introduced by companies. In this concept, the proportion of parity chunks in each stripe is suppressed, so that considerable storage savings may be achieved. However, how to generate wide stripes with less overhead is still an important issue. In particular, when the currently stored erasure code stripes (called narrow stripes) are re-encoded into wide stripes, a considerable amount of bandwidth overheads may be triggered when the data chunks are relocated and the parity chunks are regenerated for the wide stripes.

SUMMARY

In view of the defects of the related art, the purpose of the disclosure is to provide a stripe merging method and system based on erasure codes aiming to solve the problem that a large amount of bandwidth overhead is triggered when erasure code stripes are re-encoded and merged into wide stripes in the related art.

To achieve the foregoing purpose, in the first aspect, the disclosure provides a stripe merging method based on erasure codes, and the method includes the following steps.

In step S1, a plurality of erasure code stripes are pre-processed, a storage location of a parity chunk of each of the erasure code stripes is determined, and a hash table is established. The hash table indicates a location of the parity chunk of each of the erasure code stripes and a serial number of each of the erasure code stripes.

In step S2, a set of erasure code stripes that are fully aligned and partially aligned with a location of a parity chunk of a specific erasure code stripe among the erasure code stripes is determined based on the hash table, an erasure code stripe with a relatively low merging overhead with the specific erasure code stripe is selected from the set of erasure code stripes, and the selected erasure code stripe is merged with the specific erasure code stripe to generate a merged stripe.

In step S3, the selected erasure code stripe and the specific erasure code stripe are deleted from the erasure code stripes to obtain a plurality of updated erasure code stripes.

In step S4, step S2 and step S3 are repeatedly performed, and step S5 is performed when two erasure code stripes that can be merged cannot be selected.

In step S5, among the updated erasure code stripes obtained in step S3, a merging overhead of an erasure code stripe pair formed by any two erasure code stripes is calculated.

In step S6, erasure code stripe pairs with a lowest merging overhead among all erasure code stripe pairs are selected, and the selected erasure code stripe pairs are merged to generate a merged stripe.

In step S7, erasure code stripe pairs related to the erasure code stripe pairs selected in step S6 among all erasure code stripe pairs are deleted to obtain all new erasure code stripe pairs. The erasure code stripe pairs related to the erasure code stripe pairs selected in step S6 refer to each of the erasure code stripe pairs containing one of the erasure code stripes of the erasure code stripe pairs selected in step S6.

In step S8, step S6 and step S7 are repeatedly performed until all erasure code stripe pairs obtained in step S7 are empty.

In an optional embodiment, in step S2, the step of selecting the erasure code stripe with a relatively low merging overhead with the specific erasure code stripe from the set of erasure code stripes further includes the following steps.

When the set of erasure code stripes includes the erasure code stripes whose locations of the parity chunks are fully aligned with the location of the parity chunk of the specific erasure code stripe, an erasure code stripe with a lowest merging overhead or with a merging overhead less than a threshold is selected from the aligned erasure code stripes.

When the set of erasure code stripes does not include the erasure code stripes whose locations of the parity chunks are aligned with the location of the parity chunk of the specific erasure code stripe, an erasure code stripe with a lowest merging overhead or with a merging overhead less than the threshold is selected from the partially aligned erasure code stripes. The partially aligned erasure code stripes are selected according to an order of numbers of aligned parity chunks from wide to small, and each of the numbers of aligned parity chunks refer to the number of aligned parity chunks in two partially aligned erasure code stripes.

It can be understood that in the disclosure, when selection of merged erasure code stripe pairs is performed, the erasure code stripe pair with the largest number of aligned parity chunks is selected first, the erasure code stripe pair with a relatively large number of aligned parity chunks is selected next, and the rest is deduced by analogy. This process may be understood as a "greedy strategy", and the so-called greedy strategy refers to taking the best choice under the current situation every time, hoping to obtain the best overall result. In the disclosure, the narrow stripe pairs to be merged are selected based on the "greedy strategy", and a lot of unnecessary computing overhead is reduced in this way.

In an optional embodiment, merging of two erasure code stripes specifically includes the following steps.

Locations of data chunks in the erasure code stripes are checked, and if two data chunks are stored in a specific node together, one of the data chunks is migrated to an idle node for the current merged stripe.

All parity chunks with a same coding coefficient are migrated into a same node.

If a data chuck is still provided in the node where the parity chunks are stored, the data chuck is migrated.

A sum of a number of parity chunks and a number of data chunks migrated in the above process is a merging overhead.

In an optional embodiment, the process of step S5 to step S8 is called a StripeMerge-G algorithm specifically including the following steps.

In step S10, in an inputted set of narrow stripes, a merging overhead of any two narrow stripes is calculated, and a triple $(c, s_i, s_j)$ is stored in a set $C$. Herein, $s_i$ and $s_j$ represent two different narrow stripes, c represents the merging overhead of $s_i$ and $s_j$, the set of narrow stripes refers to a set of erasure code stripes, and each of the erasure code stripes corresponds to a narrow stripe.

In step S20, all triples in the set $C$ are sorted in an ascending order according to c.

In step S30, a first triple $(c^*, s_i^*, s_j^*)$ in the set z,21 is taken out, $s_i^*$ and $s_j^*$ are merged, and all triples in the set $C$ that contain $s_i^*$ and $s_j^*$ are deleted. Herein, $s_i^*$ and $s_j^*$ represent two different narrow stripes after sorting, and $c^*$ represents the merging overhead of $s_i^*$ and $s_j^*$.

In step S40, step S30 is repeatedly performed until the set z,21 is empty.

To be specific, the narrow stripes in the disclosure refer to the erasure code stripes before merging. Each erasure code stripe includes the same number of data chucks, and the number of data chunks of the merged stripe is twice the number of data chunks of the narrow stripe, so the merged stripe may be called a wide stripe.

In an optional embodiment, the process of step S2 to step S4 is called a StripeMerge-P algorithm specifically including the following steps.

The set of narrow stripes and a set of fully aligned or partially aligned parity chunks are determined.

Narrow stripe pairs in the set of fully aligned or partially aligned parity chunks are sorted according to a number of aligned parity chunks from large to small, and the narrow stripe pairs with a lowest merging overhead or with a merging overhead less than the threshold are sequentially looked for and merged.

The StripeMerge-G algorithm is performed on the remaining narrow stripes.

In the second aspect, the disclosure provides a stripe merging system based on erasure codes, and the system includes the following.

An erasure code stripe processing unit configured for performing step Si is included. In step S1, a plurality of erasure code stripes are pre-processed, a storage location of a parity chunk of each of the erasure code stripes is determined, and a hash table is established. The hash table indicates a location of the parity chunk of each of the erasure code stripes and a serial number of each of the erasure code stripes.

A first merging unit configured for performing step S2 to step S4 is included. In step S2, a set of erasure code stripes that are fully aligned and partially aligned with a location of a parity chunk of a specific erasure code stripe among the erasure code stripes is determined based on the hash table, an erasure code stripe with a relatively low merging overhead with the specific erasure code stripe is selected from the set of erasure code stripes, and the selected erasure code stripe is merged with the specific erasure code stripe to generate a merged stripe. In step S3, the selected erasure code stripe and the specific erasure code stripe are deleted from the erasure code stripes to obtain a plurality of updated erasure code stripes. In step S4, step S2 and step S3 are repeatedly performed, and when two erasure code stripes that can be merged cannot be selected, a second merging unit is indicated to perform step S5.

A second merging unit configured for performing step S5 to step S8 is included. In step S5, among the updated erasure code stripes obtained in step S3, a merging overhead of an erasure code stripe pair formed by any two erasure code stripes is calculated. In step S6, erasure code stripe pairs with a lowest merging overhead among all erasure code stripe pairs are selected, and the selected erasure code stripe pairs are merged to generate a merged stripe. In step S7, erasure code stripe pairs related to the erasure code stripe pairs selected in step S6 among all erasure code stripe pairs are deleted to obtain all new erasure code stripe pairs. The erasure code stripe pairs related to the erasure code stripe pairs selected in step S6 refer to each of the erasure code stripe pairs containing one of the erasure code stripes of the erasure code stripe pairs selected in step S6. In step S8, step S6 and step S7 are repeatedly performed until all erasure code stripe pairs obtained in step S7 are empty.

In an optional embodiment, in the process of performing step S2 by the first merging unit, the step of selecting the erasure code stripe with a relatively low merging overhead with the specific erasure code stripe from the set of erasure code stripes further includes the following steps. When the set of erasure code stripes includes the erasure code stripes whose locations of the parity chunks are fully aligned with the location of the parity chunk of the specific erasure code stripe, an erasure code stripe with a lowest merging overhead or with a merging overhead less than a threshold is selected from the aligned erasure code stripes. When the set of erasure code stripes does not include the erasure code stripes whose locations of the parity chunks are aligned with the location of the parity chunk of the specific erasure code stripe, an erasure code stripe with a lowest merging overhead or with a merging overhead less than the threshold is selected from the partially aligned erasure code stripes. The partially aligned erasure code stripes are selected according to an order of numbers of aligned parity chunks from large to small, and each of the numbers of aligned parity chunks refer to the number of aligned parity chunks in two partially aligned erasure code stripes.

In an optional embodiment, merging of two erasure code stripes by the first merging unit and the second merging unit specifically includes the following steps. Locations of data chunks in the erasure code stripes are checked, and if two data chunks are stored in a specific node together, one of the data chunks is migrated to an idle node for the current merged stripe. All parity chunks with same encoding coefficients are migrated into a same node. If a data chuck is still provided in the node where the parity chunks are stored, the data chuck is migrated. A sum of a number of parity chunks and a number of data chunks migrated in the above process is a merging overhead.

In an optional embodiment, the process of performing step S5 to step S8 by the second merging unit is called a StripeMerge-G algorithm specifically including the following steps.

In step S10, in an inputted set of narrow stripes, a merging overhead of any two narrow stripes is calculated, and a triple $(c, s_i, s_j)$ is stored in a set $C$. Herein, $s_i$ and $s_j$, represent two different narrow stripes, c represents the merging overhead of $s_i$ and $s_j$, the set of narrow stripes refers to a set of erasure code stripes, and each of the erasure code stripes corresponds to a narrow stripe.

In step S20, all triples in the set z,22 are sorted in an ascending order according to c.

In step S30, a first triple $(c^*, s_i^*, s_j^*)$ in the set $\mathcal{C}$ is taken out, $s_i^*$ and $s_j^*$ are merged, and all triples in the set $\mathcal{C}$ that contain $s_i^*$ and $s_j^*$ are deleted. Herein, $s_i^*$ and $s_j^*$ represent two different narrow stripes after sorting, and $c^*$ represents the merging overhead of $s_i^*$ and $s_j^*$.

In step S40, step S30 is repeatedly performed until the set $\mathcal{C}$ is empty.

In an optional embodiment, the process of performing step S2 to step S4 by the first merging unit is called a StripeMerge-P algorithm specifically including the following steps.

The set of narrow stripes and a set of fully aligned or partially aligned parity chunks are determined.

Narrow stripe pairs in the set of fully aligned or partially aligned parity chunks are sorted according to a number of aligned parity chucks from large to small, and the narrow stripe pairs with a lowest merging overhead or with a merging overhead less than the threshold are sequentially looked for and merged.

The StripeMerge-G algorithm is performed on the remaining narrow stripes.

To sum up, the above technical solutions provided by the disclosure have the following beneficial effects compared with the related art.

In the stripe merging method and system based on erasure codes provided by the disclosure, the StripeMerge-P algorithm is used first to determine the alignment information of the parity chunks of the erasure code stripes based on the preprocessed hash table. Through the "greedy strategy", the erasure code stripe pairs to be merged are selected for merging. Through the hash table, the set of stripes whose parity chunks are fully aligned and the set of stripes whose parity chunks are partially aligned may be looked up, so that no additional computing overhead is required, and the overhead of selecting and merging the erasure code stripe pairs is further reduced through the combination with the greedy strategy. Compared with the method of directly using the StripeMerge-G algorithm to calculate the merging overhead comparison of any two erasure code stripe pairs, in the disclosure, through the StripeMerge-P algorithm, the erasure code stripe pair with a relatively low merging overhead is selected first with a relatively low computing overhead, and the StripeMerge-G algorithm is performed next on the remaining erasure code stripes to select the merged erasure code stripe pair. In this way, it is ensured that the overall computing overhead and merging overhead are relatively low, and the computing overhead during the erasure code stripe merging process is reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

To better illustrate the goal, technical solutions, and advantages of the disclosure, the following embodiments accompanied with drawings are provided so that the disclosure are further described in detail. It should be understood that the specific embodiments described herein serve to explain the disclosure merely and are not used to limit the disclosure.

In view of the above defects and improvement requirements of the related art, the disclosure provides a stripe merging method and system based on erasure codes with an aim to minimize generated bandwidths of wide stripes. The algorithms include a calculation method of the merging overhead of two narrow stripes, a StripeMerge-G algorithm and a StripeMerge-P algorithm. The merging overhead of two narrow stripes is one of the important indicators in the process of generating wide stripes. Based on this indicator, the StripeMerge-G algorithm and the StripeMerge-P algorithm are executed to generate wide stripes with less overhead.

Figure 1:
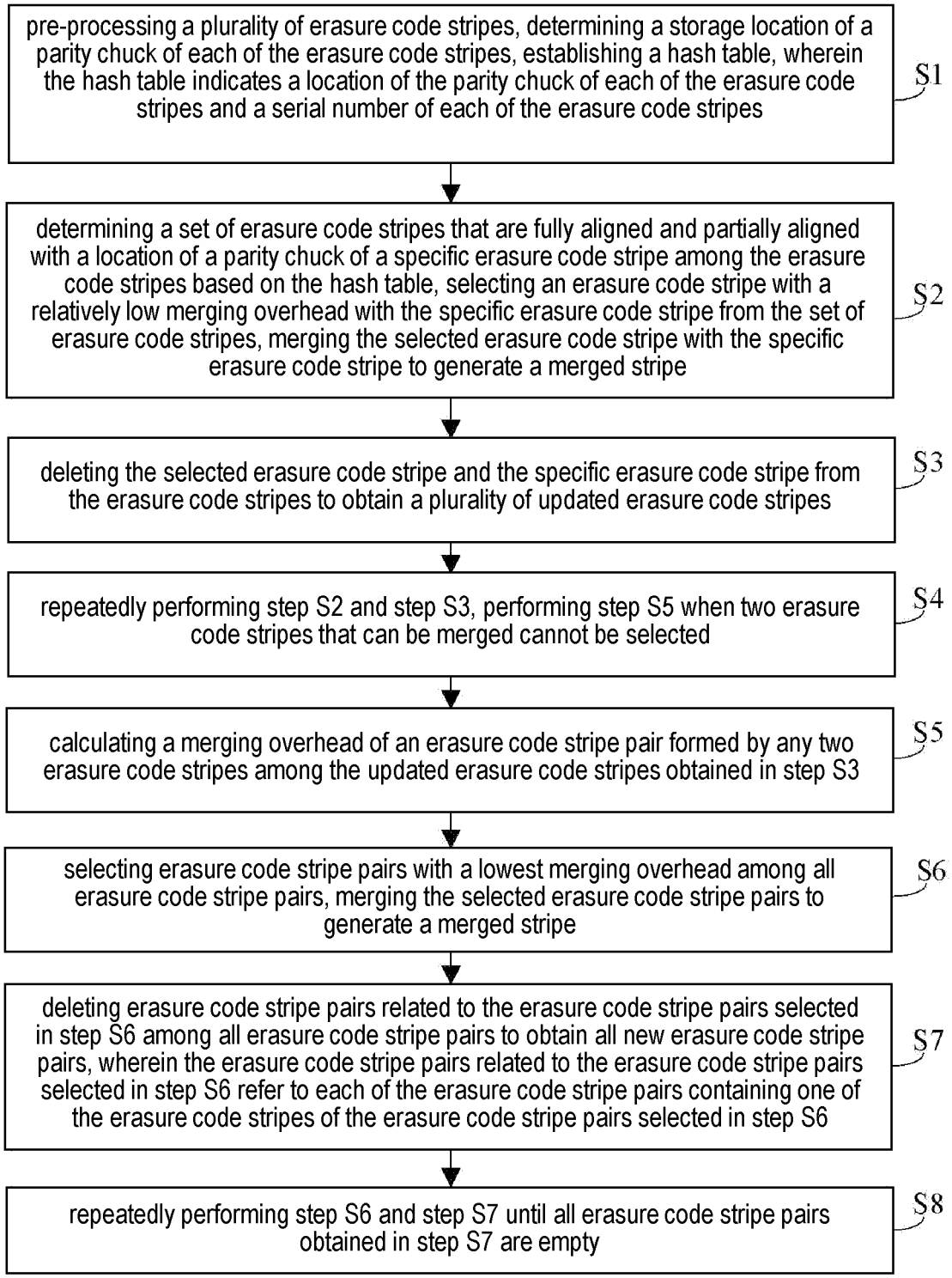
FIG. 1 is a flow chart of a stripe merging method based on erasure codes according to an embodiment of the disclosure.

FIG. 1 is a flow chart of a stripe merging method based on erasure codes according to an embodiment of the disclosure, and as shown in FIG. 1, the following steps are included.

In step S1, a plurality of erasure code stripes are preprocessed, a storage location of a parity chunk of each of the erasure code stripes is determined, and a hash table is established. The hash table indicates a location of the parity chunk of each of the erasure code stripes and a serial number of each of the erasure code stripes.

In step S2, a set of erasure code stripes that are fully aligned and partially aligned with a location of a parity chunk of a specific erasure code stripe among the erasure code stripes is determined based on the hash table, an erasure code stripe with a relatively low merging overhead with the specific erasure code stripe is selected from the set of erasure code stripes, and the selected erasure code stripe is merged with the specific erasure code stripe to generate a merged stripe.

In step S3, the selected erasure code stripe and the specific erasure code stripe are deleted from the erasure code stripes to obtain a plurality of updated erasure code stripes.

In step S4, step S2 and step S3 are repeatedly performed, and step S5 is performed when two erasure code stripes that can be merged cannot be selected.

In step S5, among the updated erasure code stripes obtained in step S3, a merging overhead of an erasure code stripe pair formed by any two erasure code stripes is calculated.

In step S6, erasure code stripe pairs with a lowest merging overhead among all erasure code stripe pairs are selected, and the selected erasure code stripe pairs are merged to generate a merged stripe.

In step S7, erasure code stripe pairs related to the erasure code stripe pairs selected in step S6 among all erasure code stripe pairs are deleted to obtain all new erasure code stripe pairs. The erasure code stripe pairs related to the erasure code stripe pairs selected in step S6 refer to each of the erasure code stripe pairs containing one of the erasure code stripes of the erasure code stripe pairs selected in step S6.

In step S8, step S6 and step S7 are repeatedly performed until all erasure code stripe pairs obtained in step S7 are empty.

In an optional embodiment, in step S2, the step of selecting the erasure code stripe with a relatively low merging overhead with the specific erasure code stripe from the set of erasure code stripes further includes the following steps.

When the set of erasure code stripes includes the erasure code stripes whose locations of the parity chunks are fully aligned with the location of the parity chunk of the specific erasure code stripe, an erasure code stripe with a lowest merging overhead or with a merging overhead less than a threshold is selected from the aligned erasure code stripes.

When the set of erasure code stripes does not include the erasure code stripes whose locations of the parity chunks are aligned with the location of the parity chunk of the specific erasure code stripe, an erasure code stripe with a lowest merging overhead or with a merging overhead less than the threshold is selected from the partially aligned erasure code stripes. The partially aligned erasure code stripes are selected according to an order of numbers of aligned parity chunks from large to small, and each of the numbers of aligned parity chunks refer to the number of aligned parity chunks in two partially aligned erasure code stripes.

In an optional embodiment, merging of two erasure code stripes specifically includes the following steps.

Locations of data chunks in the erasure code stripes are checked, and if two data chunks are stored in a specific node together, one of the data chunks is migrated to an idle node for the current merged stripe.

All parity chunks with a same coding coefficient are migrated into a same node.

If a data chuck is still provided in the node where the parity chunks are stored, the data chuck is migrated.

A sum of a number of parity chunks and a number of data chunks migrated in the above process is a merging overhead.

In an optional embodiment, the process of step S5 to step S8 is called the StripeMerge-G algorithm specifically including the following steps.

In step S10, in an inputted set of narrow stripes, a merging overhead of any two narrow stripes is calculated, and a triple $(c, s_i, s_j)$ is stored in a set $\mathcal{C}$. Herein, $s_i$ and $s_j$ represent two different narrow stripes, c represents the merging overhead of $s_i$ and $s_j$, the set of narrow stripes refers to a set of erasure code stripes, and each of the erasure code stripes corresponds to a narrow stripe.

In step S20, all triples in the set $\mathcal{C}$ are sorted in an ascending order according to c.

In step S30, a first triple $(c^*, s_i^*, s_j^*)$ in the set $\mathcal{C}$ is taken out, $s_i^*$ and $s_j^*$ are merged, and all triples in the set $\mathcal{C}$ that contain $s_i^*$ and $s_j^*$ are deleted. Herein, $s_i^*$ and $s_j^*$ represent two different narrow stripes after sorting, and $c^*$ represents the merging overhead of $s_i^*$ and $s_j^*$.

In step S40, step S30 is repeatedly performed until the set $\mathcal{C}$ is empty.

In an optional embodiment, the process of step S2 to step S4 is called the StripeMerge-P algorithm specifically including the following steps.

The set of narrow stripes and a set of fully aligned or partially aligned parity chunks are determined.

Narrow stripe pairs in the set of fully aligned or partially aligned parity chunks are sorted according to a number of aligned data chunks from large to small, and the narrow stripe pairs with a lowest merging overhead or with a merging overhead less than the threshold are sequentially looked for and merged.

The StripeMerge-G algorithm is performed on the remaining narrow stripes.

To be more specific, in a specific embodiment, in a storage system based on Reed-solomon (RS) codes, for each stripe, all k pieces of data are encoded by using the RS codes to generate n−k parity chunks, where the RS codes belong to a type of the erasure codes. These n chunks form a stripe, and any k chunks among the n chunks can repair the original data.

Figure 2:
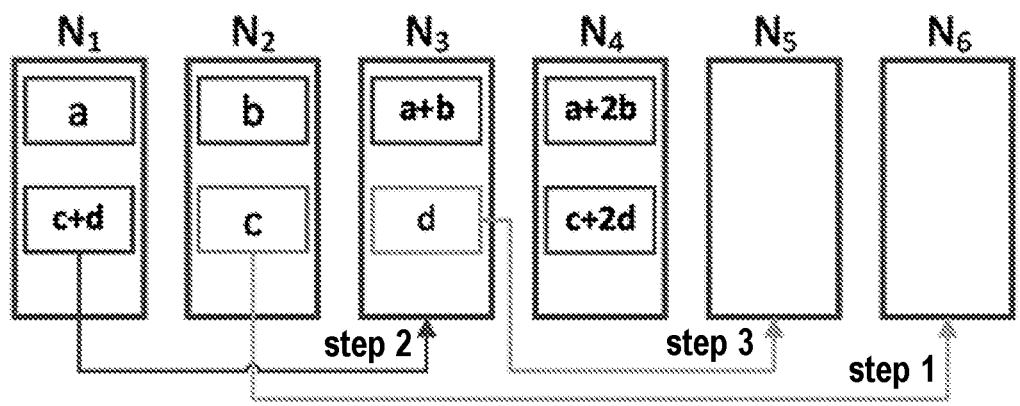
FIG. 2 is a schematic diagram of chuck migration steps in a process of merging two narrow stripes into one wide stripe according to an embodiment of the disclosure.

FIG. 2 shows an example of chuck migration in the process of merging narrow stripes of (n, k)=(4, 2) into wide stripes of (n, k)=(6, 2), and $N_1$ to $N_6$ are 6 nodes.

The stripe merging method based on erasure codes provided by the disclosure includes the following steps.

(F1) Arrangement of data chunks is checked. If two data chunks are stored in a specific node together, one of the data chunks is migrated to an idle node for the current merged wide stripe.

As shown in FIG. 2, a data chuck b and a data chuck c are both provided in the node $N_2$, and the data chuck c is migrated to the node $N_6$.

(F2) All parity chunks with a same coding coefficient are migrated into the same node.

As shown in FIG. 2, a parity chunk c+d in the node $N_1$ and a parity chunk a+b in the node $N_3$ have the same coding coefficient, so these parity chunks are migrated into the same node.

(F3) If a data chuck is still provided in the node where the parity chunks are stored, the data chuck is migrated.

As shown in FIG. 2, after the first two migrations are completed but the data chuck d is still provided in the node $N_3$, and the data chuck d is then migrated to the node $N_5$.

(F4) The number of chunks migrated in this process is the merging overhead.

As shown in FIG. 2, a total of 3 chunks are migrated in this process, so the merging overhead is 3.

Figure 3:
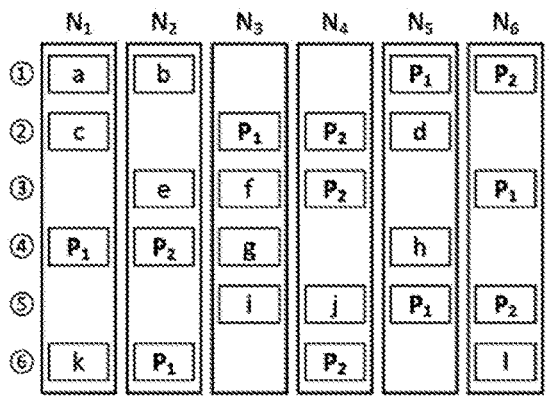
FIG. 3 is a schematic diagram of operation steps of a StripeMerge-P algorithm according to an embodiment of the disclosure.

FIG. 3 shows an example of merging narrow stripes of (n, k)=(4, 2) into wide stripes of (n, k)=(6, 2).

The stripe merging method based on erasure codes provided by the disclosure includes the following steps.

(T1) A set of narrow stripes and an i-part check alignment set are inputted.

As shown in FIG. 2, a hash table is established according to a distribution of parity chunks in the stripes. The key of the hash table is the locations of the parity chunks P1 and P2, and the value of the hash table is the serial numbers of the stripes whose parity chunks satisfy the corresponding distribution. The i-part check alignment set may be efficiently obtained through the hash table.

Herein, the i-part check alignment set refers to a set formed by stripes having i aligned parity chunks for a specific narrow stripe, and i represents the number of aligned parity chunks.

(T2) According to the order of i from large to small, each i-part check alignment set is selected in turn, each narrow stripe is checked to look for the pairs with the lowest merging overhead in the set, and if these pairs are close to optimal matching, these pairs are aligned and merged.

As shown in FIG. 3, in a 2-part check alignment set, since a stripe 1 and a stripe 5 satisfy optimal matching, the stripe 1 and the stripe 5 are merged. In a 1-part check alignment set, since a stripe 2 and a stripe 3 are close to optimal matching, the stripe 2 and the stripe 3 are merged.

(T3) The StripeMerge-G algorithm is performed on the remaining narrow stripes.

As shown in FIG. 3, the StripeMerge-G algorithm is performed on the remaining narrow stripes 4 and 6.

In general, in the stripe merging method based on erasure codes provided by the disclosure, the overhead of wide stripe generation may be reduced, and efficiency of generation of wide stripes may be improved.

Figure 4:
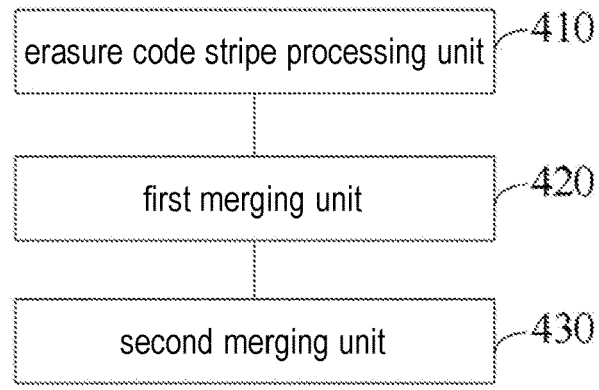
FIG. 4 is an architecture diagram of a stripe merging system based on erasure codes according to an embodiment of the disclosure.

FIG. 4 is an architecture diagram of a stripe merging system based on erasure codes according to an embodiment of the disclosure, and as shown in FIG. 4, the system includes the following.

An erasure code stripe processing unit 410 configured for performing step Si is included. In step S1, a plurality of erasure code stripes are pre-processed, a storage location of a parity chunk of each of the erasure code stripes is determined, and a hash table is established. The hash table indicates a location of the parity chunk of each of the erasure code stripes and a serial number of each of the erasure code stripes.

A first merging unit 420 configured for performing step S2 to step S4 is included. In step S2, a set of erasure code stripes that are fully aligned and partially aligned with a location of a parity chunk of a specific erasure code stripe among the erasure code stripes is determined based on the hash table, an erasure code stripe with a relatively low merging overhead with the specific erasure code stripe is selected from the set of erasure code stripes, and the selected erasure code stripe is merged with the specific erasure code stripe to generate a merged stripe. In step S3, the selected erasure code stripe and the specific erasure code stripe are deleted from the erasure code stripes to obtain a plurality of updated erasure code stripes. In step S4, step S2 and step S3 are repeatedly performed, and when two erasure code stripes that can be merged cannot be selected, a second merging unit is indicated to perform step S5.

A second merging unit 430 configured for performing step S5 to step S8 is included. In step S5, among the updated erasure code stripes obtained in step S3, a merging overhead of an erasure code stripe pair formed by any two erasure code stripes is calculated. In step S6, erasure code stripe pairs with a lowest merging overhead among all erasure code stripe pairs are selected, and the selected erasure code stripe pairs are merged to generate a merged stripe. In step S7, erasure code stripe pairs related to the erasure code stripe pairs selected in step S6 among all erasure code stripe pairs are deleted to obtain all new erasure code stripe pairs. The erasure code stripe pairs related to the erasure code stripe pairs selected in step S6 refer to each of the erasure code stripe pairs containing one of the erasure code stripes of the erasure code stripe pairs selected in step S6. In step S8, step S6 and step S7 are repeatedly performed until all erasure code stripe pairs obtained in step S7 are empty.

It can be understood that the detailed functional implementation of the foregoing units may be found with reference to the introduction in the foregoing method embodiments, and description thereof is not repeated herein.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A stripe merging method based on erasure codes, comprising:

step S1, pre-processing a plurality of erasure code stripes, determining a storage location of a parity chunk of each of the erasure code stripes, establishing a hash table, wherein the hash table indicates a location of the parity chunk of each of the erasure code stripes and a serial number of each of the erasure code stripes;

step S2, determining a set of erasure code stripes that are fully aligned and partially aligned with a location of a parity chunk of a specific erasure code stripe among the erasure code stripes based on the hash table, selecting an erasure code stripe with a relatively low merging overhead with the specific erasure code stripe from the set of erasure code stripes, merging the selected erasure code stripe with the specific erasure code stripe to generate a merged stripe;

step S3, deleting the selected erasure code stripe and the specific erasure code stripe from the erasure code stripes to obtain a plurality of updated erasure code stripes;

step S4, repeatedly performing step S2 and step S3;

step S5, calculating a merging overhead of an erasure code stripe pair formed by any two erasure code stripes among the updated erasure code stripes obtained in step S3 when two erasure code stripes that can be merged not be selected;

step S6, selecting erasure code stripe pairs with a lowest merging overhead among all erasure code stripe pairs, merging the selected erasure code stripe pairs to generate a merged stripe;

step S7, deleting erasure code stripe pairs related to the erasure code stripe pairs selected in step S6 among all erasure code stripe pairs to obtain all new erasure code stripe pairs, wherein the erasure code stripe pairs related to the erasure code stripe pairs selected in step S6 refer to each of the erasure code stripe pairs containing one of the erasure code stripes of the erasure code stripe pairs selected in step S6; and step S8, repeatedly performing step S6 and step S7 until all erasure code stripe pairs obtained in step S7 are empty.

2. The stripe merging method according to claim 1, wherein the step of selecting the erasure code stripe with a relatively low merging overhead with the specific erasure code stripe from the set of erasure code stripes in step S2 further comprises:

selecting an erasure code stripe with a lowest merging overhead or with a merging overhead less than a threshold from the aligned erasure code stripes when the set of erasure code stripes includes the erasure code stripes whose locations of the parity chunks are fully aligned with the location of the parity chunk of the specific erasure code stripe; and selecting the erasure code stripe with the lowest merging overhead or with the merging overhead less than the threshold from the partially aligned erasure code stripes when the set of erasure code stripes does not include the erasure code stripes whose locations of the parity chunks are aligned with the location of the parity chunk of the specific erasure code stripe, wherein the partially aligned erasure code stripes are selected according to an order of numbers of aligned parity chunks from large to small, and each of the numbers of aligned parity chunks refer to the number of aligned parity chunks in two partially aligned erasure code stripes.

3. The stripe merging method according to claim 2, wherein the process of step S5 to step S8 is called a StripeMerge-G algorithm specifically comprising the following steps:

step S10, calculating a merging overhead of any two narrow stripes in an inputted set of narrow stripes, storing a triple (c, $s_i$, $s_j$) in a set $\mathcal{C}$, wherein $s_i$ and $s_j$ represent two different narrow stripes, c represents the merging overhead of $s_i$ and $s_j$, the set of narrow stripes refers to a set of erasure code stripes, and each of the erasure code stripes corresponds to a narrow stripe;

step S20, sorting all triples in the set $\mathcal{C}$ in an ascending order according to c;

step S30, taking out a first triple (c*, $s_i$*, $s_j$*) in the set $\mathcal{C}$, merging $s_i$* and $s_j$*, deleting all triples in the set $\mathcal{C}$ that contain $s_i$* and $s_j$*, wherein $s_i$* and $s_j$* represent two different narrow stripes after sorting, and c* represents the merging overhead of $s_i$* and $s_j$*; and step S40, repeatedly performing step S30 until the set $\mathcal{C}$ is empty.

4. The stripe merging method according to claim 3, wherein the process of step S2 to step S4 is called a StripeMerge-P algorithm specifically comprising the following steps:

determining the set of narrow stripes and a set of fully aligned or partially aligned parity chucks;

sorting narrow stripe pairs in the set of fully aligned or partially aligned parity chunks according to a number of aligned data chunks from large to small, sequentially looking for and merging the narrow stripe pairs with a lowest merging overhead or with a merging overhead less than the threshold; and performing the StripeMerge-G algorithm on the remaining narrow stripes.

5. The stripe merging method according to claim 1, wherein the step of merging the selected erasure code stripe with the specific erasure code stripe in step S2 specifically comprises the following steps:

checking locations of data chunks in the erasure code stripes, wherein if two data chunks are stored in a specific node together, one of the data chunks is migrated to an idle node for the current merged stripe;

migrating all parity chunks with a same coding coefficient into a same node; and migrating the data chuck if a data chuck is still provided in the node where the parity chunks are stored, wherein a sum of a number of parity chunks and a number of data chunks migrated in the above process is a merging overhead.

6. A stripe merging system based on erasure codes, comprising:

an erasure code stripe processing unit configured for performing step S1, wherein step S1 is pre-processing a plurality of erasure code stripes, determining a storage location of a parity chunk of each of the erasure code stripes, establishing a hash table, wherein the hash table indicates a location of the parity chunk of each of the erasure code stripes and a serial number of each of the erasure code stripes;

a first merging unit configured for performing sequentially step S2, S3, and step S4, wherein step S2 is determining a set of erasure code stripes that are fully aligned and partially aligned with a location of a parity chunk of a specific erasure code stripe among the erasure code stripes based on the hash table, selecting an erasure code stripe with a relatively low merging overhead with the specific erasure code stripe from the set of erasure code stripes, merging the selected erasure code stripe with the specific erasure code stripe to generate a merged stripe, wherein step S3 is deleting the selected erasure code stripe and the specific erasure code stripe from the erasure code stripes to obtain a plurality of updated erasure code stripes, wherein step S4 is repeatedly performing step S2 and step S3; and the second merging unit configured for performing sequentially step S5, step S6, step S7, and step S8, wherein step S5 is calculating a merging overhead of an erasure code stripe pair formed by any two erasure code stripes among the updated erasure code stripes obtained in step S3 when two erasure code stripes that can be merged cannot be selected, wherein step S6 is selecting erasure code stripe pairs with a lowest merging overhead among all erasure code stripe pairs and merging the selected erasure code stripe pairs to generate a merged stripe, wherein step S7 is deleting erasure code stripe pairs related to the erasure code stripe pairs selected in step S6 among all erasure code stripe pairs to obtain all new erasure code stripe pairs, wherein the erasure code stripe pairs related to the erasure code stripe pairs selected in step S6 refer to each of the erasure code stripe pairs containing one of the erasure code stripes of the erasure code stripe pairs selected in the step S6, where step S8 is repeatedly performing step S6 and step S7 until all erasure code stripe pairs obtained in step S7 are empty.

7. The stripe merging system according to claim 6, wherein the step of selecting the erasure code stripe with a relatively low merging overhead with the specific erasure code stripe from the set of erasure code stripes in the process of performing step S2 by the first merging unit further comprises:

selecting an erasure code stripe with a lowest merging overhead or with a merging overhead less than a threshold from the aligned erasure code stripes when the set of erasure code stripes includes the erasure code stripes whose locations of the parity chunks are fully aligned with the location of the parity chunk of the specific erasure code stripe; and selecting an erasure code stripe with a lowest merging overhead or with a merging overhead less than the threshold from the partially aligned erasure code stripes when the set of erasure code stripes does not include the erasure code stripes whose locations of the parity chunks are aligned with the location of the parity chunk of the specific erasure code stripe, wherein the partially aligned erasure code stripes are selected according to an order of numbers of aligned parity chunks from large to small, and each of the numbers of aligned parity chunks refer to the number of aligned parity chunks in two partially aligned erasure code stripes.

8. The stripe merging system according to claim 7, wherein the process of performing step S5 to step S8 by the second merging unit is called a StripeMerge-G algorithm specifically comprising:

step S10, calculating a merging overhead of any two narrow stripes in an inputted set of narrow stripes, storing a triple (c, $s_i$, $s_j$) in a set $\mathcal{C}$, wherein $s_i$ and $S_j$, represent two different narrow stripes, c represents the merging overhead of $S_i$ and $s_j$, the set of narrow stripes refers to a set of erasure code stripes, and each of the erasure code stripes corresponds to a narrow stripe;

step S20, sorting all triples in the set $\mathcal{C}$ in an ascending order according to c;

step S30, taking out a first triple (c*, $s_i$*, $s_j$*) in the set $\mathcal{C}$, merging $s_i$* and $s_j$*, deleting all triples in the set $\mathcal{C}$ that contain $s_i$* and $s_j$*, wherein $s_i$* and $s_j$* represent two different narrow stripes after sorting, and c* represents the merging overhead of $s_i$* and $s_j$*; and step S40, repeatedly performing step S30 until the set $\mathcal{C}$ is empty.

9. The stripe merging system according to claim 8, wherein the process of performing step S2 to step S4 by the first merging unit is called a StripeMerge-P algorithm specifically comprising:

determining the set of narrow stripes and a set of fully aligned or partially aligned parity chucks;

sorting narrow stripe pairs in the set of fully aligned or partially aligned parity chunks according to a number of aligned data chunks from large to small, sequentially looking for and merging the narrow stripe pairs with a lowest merging overhead or with a merging overhead less than the threshold; and performing the StripeMerge-G algorithm on the remaining narrow stripes.

10. The stripe merging system according to claim 6, wherein the step of selecting erasure code stripe pairs with a lowest merging overhead among all erasure code stripe pairs and merging the selected erasure code stripe pairs in the process of performing step S6 by the second merging unit further comprises:

checking locations of data chunks in the erasure code stripes, wherein if two data chunks are stored in a specific node together, one of the data chunks is migrated to an idle node for the current merged stripe;

migrating all parity chunks with a same coding coefficient into a same node; and migrating the data chuck if a data chuck is still provided in the node where the parity chunks are stored, wherein a sum of a number of parity chunks and a number of data chunks migrated in the above process is a merging overhead.

* * * * *